(12) United States Patent
Huang et al.

(10) Patent No.: US 10,404,184 B1
(45) Date of Patent: Sep. 3, 2019

(54) RELAY ADAPTIVE TO ALTERNATIVE CURRENT AND DIRECT CURRENT INPUT SIGNALS

(71) Applicant: Wistron Corporation, New Taipei (TW)

(72) Inventors: Chih-Ping Huang, New Taipei (TW); Po-Hsun Shih, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 16/174,169

(22) Filed: Oct. 29, 2018

(30) Foreign Application Priority Data

Aug. 8, 2018 (TW) .............................. 107127695 A

(51) Int. Cl.
*H02M 7/06* (2006.01)
*H03K 17/795* (2006.01)
*H03K 5/08* (2006.01)

(52) U.S. Cl.
CPC ................ *H02M 7/06* (2013.01); *H03K 5/08* (2013.01); *H03K 17/795* (2013.01)

(58) Field of Classification Search
None
See application file for complete search history.

(56) References Cited

U.S. PATENT DOCUMENTS

| 3,953,783 A * | 4/1976 | Peters, Jr. ................. F24C 7/02 363/124 |
| 5,986,434 A * | 11/1999 | Roy ...................... H02J 7/0091 320/128 |
| 2013/0019325 A1* | 1/2013 | Deisseroth ......... A01K 67/0271 800/8 |
| 2017/0321849 A1* | 11/2017 | Xiong ..................... F21V 3/061 |

FOREIGN PATENT DOCUMENTS

| CN | 104734331 A | 6/2015 |
| DE | 100 11 863 C1 | 10/2001 |

* cited by examiner

*Primary Examiner* — Cassandra F Cox
(74) *Attorney, Agent, or Firm* — Winston Hsu

(57) ABSTRACT

A relay includes a first contact for receiving an input signal, a second contact for receiving a power signal, a rectifier coupled to the first and second contacts for converting the power signal into a direct-current power signal when the power signal is an alternating-current power signal, a voltage clamping circuit coupled to the rectifier for clamping a voltage of the input signal and the power signal, a Schmidt trigger coupled to the voltage clamping circuit for generating a trigger signal according to the input signal and the power signal, and a power outputting circuit coupled to the Schmidt trigger for generating an output voltage according to the trigger signal and a supply power.

8 Claims, 2 Drawing Sheets

US 10,404,184 B1

RELAY ADAPTIVE TO ALTERNATIVE CURRENT AND DIRECT CURRENT INPUT SIGNALS

BACKGROUND OF THE INVENTION

1. Field of the Invention

The present invention relates to a relay, and more particularly, to a relay adaptive to alternating-current and direct-current input signals.

2. Description of the Prior Art

In industrial control field, there are dry contact and wet contact. A dry contact may be defined as: a volt-free switch; either at close or open status; there is no polarity between two input signals to be swappable. A common volt-free switch at close status may be used to activate an alarm, an automatic door, an elevator, and power switches for any kinds of electronic equipment (e.g., cars, motorcycles, computers, lamps, and so on); on the contrary, the volt-free switch may deactivate the abovementioned electronic equipment when it is at open status.

A wet contact may be defined as: a volt switch; either at volt or volt-free status; there are polarities between two input signals to be non-swappable. The wet contact may receive the signal with voltage level and polarity. In practice, when a wet contact signal may be generated by connecting a dry contact signal to a terminal of a power source, i.e., the dry contact signal is wetted by the power source.

Conventionally, relays for power switches adaptive to dry and wet contacts are separately designed, which increase production cost, and is not convenient for installation because the relay for wet contact has certain polarity. In addition, a magnetic relay induces signal bounce to cause malfunction and bad reliability.

Therefore, how to design a relay adaptive to alternating-current and direct-current input signals to improve reliability has become a topic in the industry.

SUMMARY OF THE INVENTION

It is therefore an objective of the present invention to provide a relay adaptive to alternating-current and direct-current input signals, to solve the abovementioned issue.

The present invention discloses a relay including a first contact for receiving an input signal; a second contact for receiving a power signal; a rectifier coupled to the first contact and the second contact, for converting an alternating-current power signal into a direct-current power signal when the power signal is the alternating-current power signal; a voltage clamping circuit coupled to the rectifier, for clamping voltages of the direct-current power signal and the input signal; a Schmidt trigger coupled to the voltage clamping circuit, for generating a trigger signal according to the direct-current power signal and the input signal; and a power outputting circuit coupled to the Schmidt trigger, for generating an output voltage according to the trigger signal and a supply power.

The relay of the present invention utilizes the rectifier to perform bridge rectifying to the input signal to adapt to the input signal containing the direct-current or the alternating-current power; then, utilizes the voltage clamping circuit to perform voltage clamping to the rectified input signal to provide the stable operating voltage; utilizes the Schmidt trigger to generate the trigger signal according to the input signal to control operations of the power outputting circuit; finally, the trigger signal may turn on the photocoupler to generate the output voltage to the back-end equipment. Therefore, the relay of the present invention is applicable to dry and wet contacts to reduce production cost and improve installation convenience.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
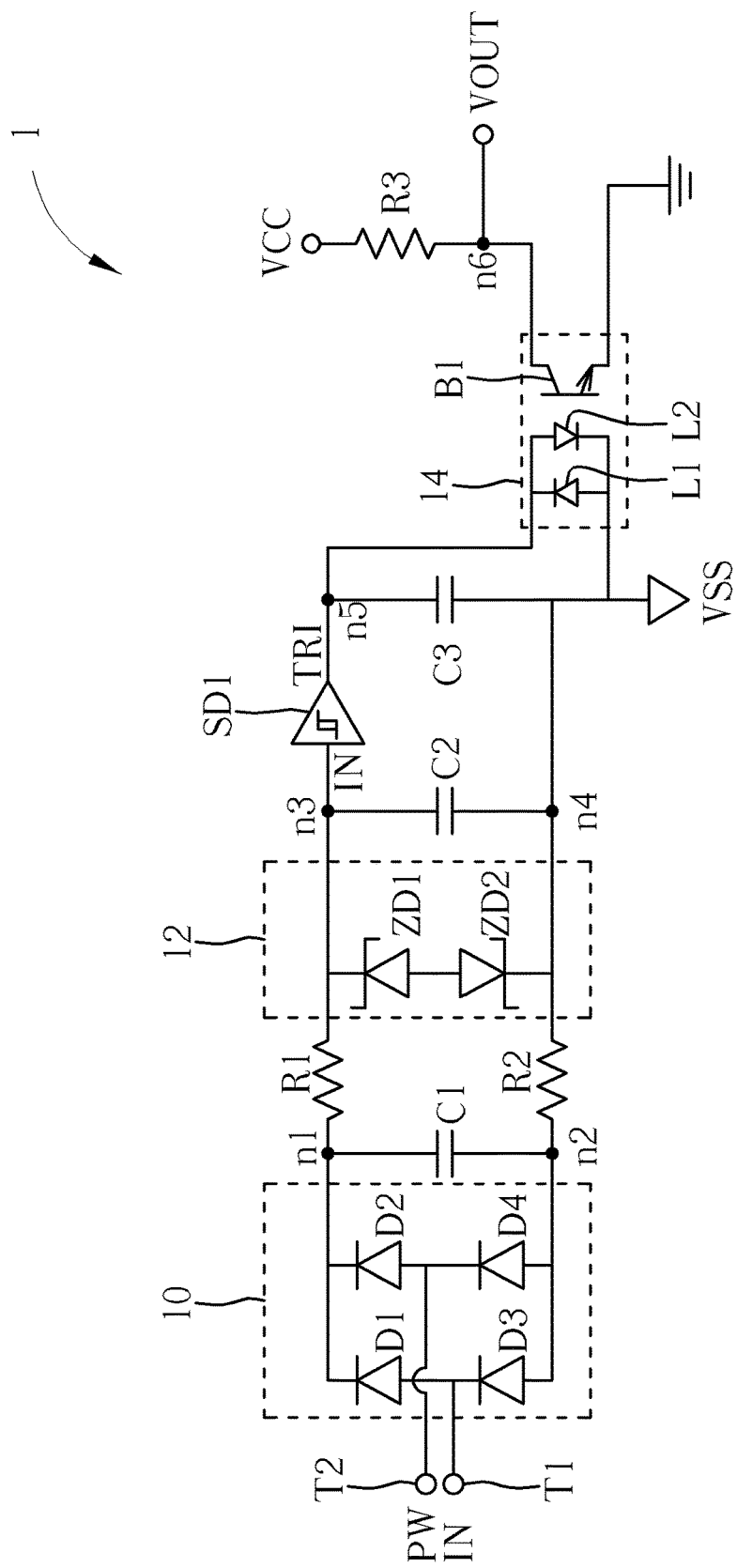
FIG. 1 is a circuit diagram of a relay according to an embodiment of the present invention.

FIG. 1 is a circuit diagram of a relay 1 according to an embodiment of the present invention. The relay 1 includes contacts T1 and T2, a rectifier 10, a voltage clamping circuit 12, a Schmidt trigger SD1, a power outputting circuit, capacitors C1, C2 and C3, and resistors R1 and R2.

The contact T1 is used for receiving an input signal IN, the contact T2 is used for receiving a power signal PW. The input signal IN may be a digital signal or an analog signal, and the power signal PW may be an alternating-current power signal or a direct-current power signal. In one embodiment, the contact T1 may be used for receiving the power signal PW, and the contact T2 may be used for receiving the input signal IN. In other words, signals inputted to the contact T1 and the contact T2 are swappable.

The rectifier 10 is coupled to contacts T1 and T2, and configured to convert the alternating-current power signal PW into a direct-current power signal PW_DC when the power signal PW is the alternating-current power signal. The voltage clamping circuit 12 is coupled to the rectifier 10, and configured to clamp the direct-current power signal PW_DC and the input signal IN at an operating voltage. The Schmidt trigger SD1 is coupled to the voltage clamping circuit 12, and configured to generate a trigger signal TRI according to the direct-current power signal PW_DC and the input signal IN. The power outputting circuit is coupled to Schmidt trigger SD1, and configured to generate an output voltage VOUT according to the trigger signal TRI and a supply power VCC.

The rectifier 10 may be a bridge rectifier, and includes diodes D1, D2, D3, and D4. The diode D1 includes an anode coupled to the contact T1, and a cathode coupled to a node n1. The diode D2 includes an anode coupled to the contact T2, and a cathode coupled to the node n1. The diode D3 includes a cathode coupled to the contact T1, and an anode coupled to a node n2. The diode D4 includes a cathode coupled to the contact T2, and an anode coupled to the node n2.

The capacitor C1 is coupled between the nodes n1 and n2, and configured to reduce signal ripples of the power signal PW and the input signal IN to stabilize voltages.

The voltage clamping circuit 12 is coupled to the resistors R1 and R2, and the nodes n3 and n4. The voltage clamping circuit 12 includes Zener diodes ZD1 and ZD2. The Zener diode ZD1 includes a cathode coupled to the node n3, and an anode coupled to an anode of the Zener diode ZD2. The Zener diode ZD2 includes the anode coupled to the anode of the Zener diode ZD1, and a cathode coupled to the node n4. A stable operating voltage may be supplied to a photocoupler 14 of the power outputting circuit when the Zener diode ZD1 or ZD2 breaks down, which improves lifetime of elements comprised in the relay 1.

One end of the resistor R1 is coupled to the node n1, and another end of the resistor R1 is coupled to the voltage clamping circuit 12 (i.e., the cathode of the Zener diode ZD1 and the node n3). One end of the resistor R2 is coupled to node n2, and another end of the resistor R2 is coupled to the voltage clamping circuit 12 (i.e., the cathode of the Zener diode ZD2 and the node n4). The resistors R1 and R2 are current limiting resistors configured to protect the photocoupler 14 from damaging by overcurrent of the power signal PW and the input signal IN.

One end of the capacitor C2 is coupled to the node n3 and the input terminal of the Schmidt trigger SD1, and another end of the capacitor C2 is coupled to the node n4 and a low voltage VSS. One end of the capacitor C3 is coupled to the node n5 and the output terminal of the Schmidt trigger SD1, and another end of the capacitor C3 is coupled to the node n4 and the low voltage VSS. The capacitors C2 and C3 may guide high frequency noises of the input signal IN and the power signal PW to the low voltage VSS, to filter out the high frequency noises.

The power outputting circuit includes a resistor R3 and the photocoupler 14. One end of the resistor R3 is coupled to a supply voltage VCC, and another end of the resistor R3 is coupled to a node n6, wherein the node n6 is coupled to the output voltage VOUT. The resistor R3 is a current limiting resistor configured to protect the back-end equipment from damaging by overcurrent.

The photocoupler 14 includes light-emitting diodes L1 and L2, and a bipolar junction transistor B1. The light-emitting diode L1 includes a cathode coupled to the output terminal of the Schmidt trigger SD1, and an anode coupled to a low voltage VSS. The light-emitting diode L2 includes an anode coupled to the output terminal of the Schmidt trigger SD1, and a cathode coupled to the low voltage VSS. The photocoupler 14 is configured for electrical isolation to protect the front-end equipment from damaging by influences due to the back-end power.

The bipolar junction transistor B1 includes a collector coupled to the node n6, an emitter coupled to a ground, and a base for receiving a photocurrent emitted by the light-emitting diode L1 or L2 to turn on itself to generate a collector current. Therefore, the supply voltage VCC operates as the output voltage VOUT to supply to the back-end equipment when the collector current is generated.

In short, a circuit structure and corresponding operations of the relay 1 of the present invention may be summarized into four stages including current rectifying, voltage clamping, trigger control, and power outputting. In the first stage, the rectifier 10 performs bridge rectifying to adapt to the input signal IN containing the direct-current or the alternating-current power PW; in the second stage, the capacitor C1 is configured to avoid signal ripples, and the voltage clamping circuit 12 performs voltage clamping to the rectified input signal IN to provide the stable operating voltage; in the third stage, the capacitors C2 and C3 are configured to respectively filter out high frequency noises of the input signal IN and the trigger signal TRI, and the Schmidt trigger SD1 generates the trigger signal TRI according to the input signal IN to control operations of the power outputting circuit; in the fourth stage, the trigger signal TRI turns on the photocoupler 14 to generate the output voltage VOUT to the back-end equipment.

In industrial control field, the conventional relays for power switches adaptive to dry and wet contacts are separately designed, which increase production cost, and is not convenient for installation because the relay for wet contact has certain polarity. In comparison, the relay 1 of the present invention is applicable to dry and wet contacts to reduce production cost and improve installation convenience.

Figure 2:
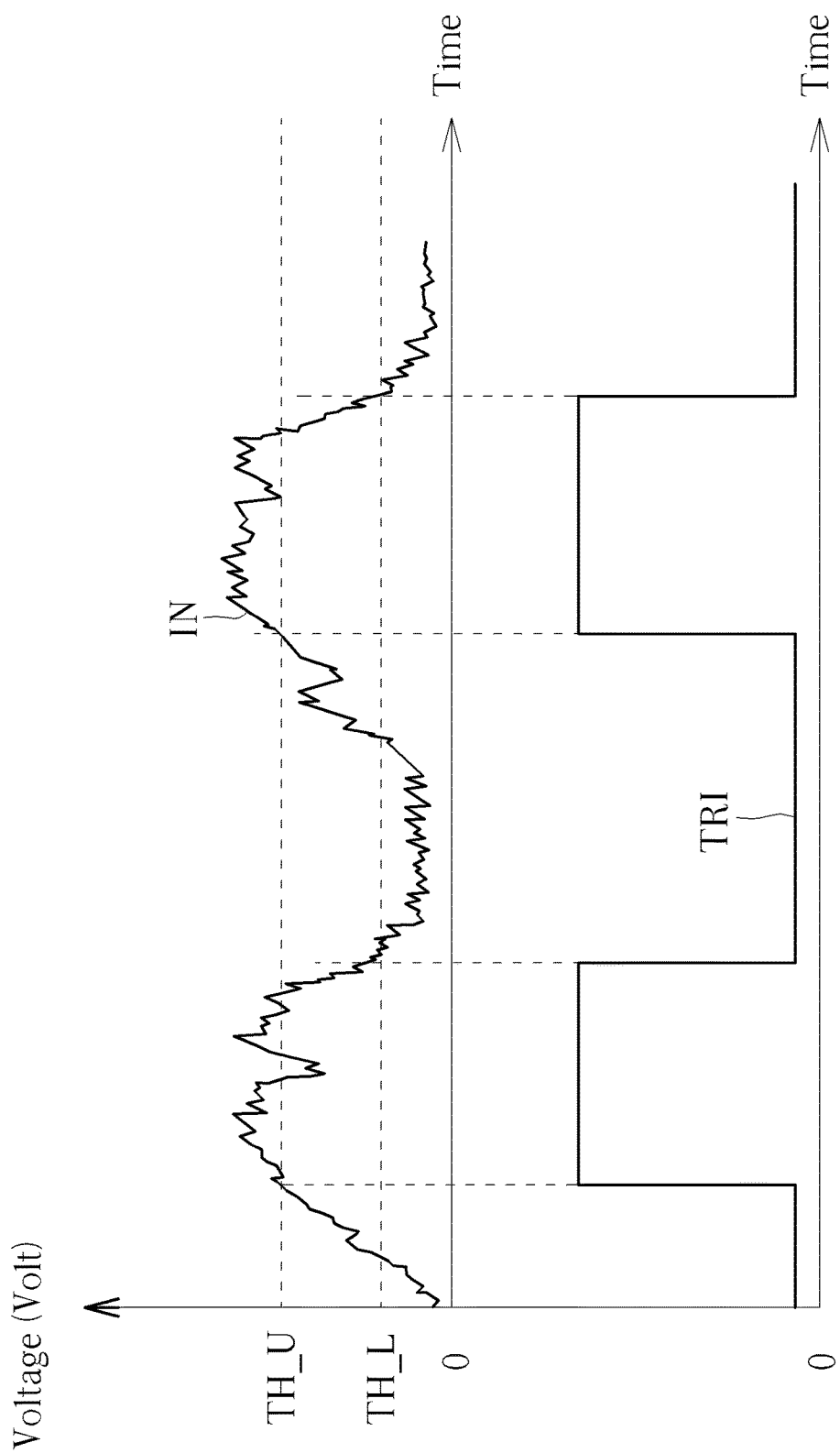
FIG. 2 illustrates a waveform of a Schmidt trigger according to an embodiment of the present invention.

FIG. 2 illustrates a waveform of the Schmidt trigger SD1 according to an embodiment of the present invention. In FIG. 2, the Schmidt trigger SD1 may generate the trigger signal TRI according to thresholds TH_U and TH_L and the input signal IN. In operation, when the Schmidt trigger SD1 detects a voltage rising at the threshold TH_U, the trigger signal TRI outputted by the Schmidt trigger SD1 is a high voltage level; when the Schmidt trigger SD1 detects a voltage falling at the threshold TH_L, the trigger signal TRI outputted by the Schmidt trigger SD1 is a voltage level; other than that, the trigger signal TRI outputted by the Schmidt trigger SD1 remains at a same voltage level.

Due to the conventional magnetic relay induces signal bounce to cause malfunction and bad reliability. In comparison, the relay 1 of the present invention utilizes the Schmidt trigger SD1 to detect voltage rising and voltage falling to avoid signal bounce and improve reliability.

To sum up, the relay of the present invention utilizes the rectifier to perform bridge rectifying to the input signal to adapt to the input signal containing the direct-current or the alternating-current power; then, utilizes the voltage clamping circuit to perform voltage clamping to the rectified input signal to provide the stable operating voltage; utilizes the Schmidt trigger to generate the trigger signal according to the input signal to control operations of the power outputting circuit; finally, the trigger signal may turn on the photocoupler to generate the output voltage to the back-end equipment. Therefore, the relay of the present invention is applicable to dry and wet contacts to reduce production cost and improve installation convenience.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A relay, comprising:
a first contact for receiving an input signal;
a second contact for receiving a power signal;
a rectifier coupled to the first contact and the second contact, for converting an alternating-current power signal into a direct-current power signal when the power signal is the alternating-current power signal;
a voltage clamping circuit coupled to the rectifier, for clamping voltages of the direct-current power signal and the input signal;
a Schmidt trigger coupled to the voltage clamping circuit, for generating a trigger signal according to the direct-current power signal and the input signal; and
a power outputting circuit coupled to the Schmidt trigger, for generating an output voltage according to the trigger signal and a supply power.

2. The relay of claim 1, wherein the rectifier comprises:
a first diode having an anode coupled to the first contact, and a cathode coupled to a first node;
a second diode, having an anode coupled to the second contact, and a cathode coupled to the first node;
a third diode having a cathode coupled to the first contact, and an anode coupled to a second node; and a fourth diode having a cathode coupled to the second contact, and an anode coupled to the second node.

3. The relay of claim 2, further comprising:
a first capacitor, having one end coupled to the first node, and another end coupled to the second node.

4. The relay of claim 2, further comprising:
a first resistor having one end coupled to the first node, and another end coupled to the voltage clamping circuit; and
a second resistor having one end coupled to the second node, and another end coupled to the voltage clamping circuit.

5. The relay of claim 1, wherein the voltage clamping circuit comprises:
a first Zener diode having a cathode coupled to a third node; and
a second Zener diode having an anode coupled to the anode of the first Zener diode, and a cathode coupled to a fourth node;
wherein the third node is coupled to an input terminal of the Schmidt trigger, and the fourth node coupled to a low voltage.

6. The relay of claim 5, further comprising:
a second capacitor having one end coupled to the third node, and another end coupled to the fourth node; and
a third capacitor having one end coupled to a fifth node, and another end coupled to the fourth node;
wherein the fifth node is coupled to an output terminal of the Schmidt trigger.

7. The relay of claim 1, wherein the power outputting circuit comprises:
a third resistor having one end coupled to a high voltage, and another end coupled to an output voltage; and
a photocoupler comprising:
a first light-emitting diode having a cathode coupled to an output terminal of the Schmidt trigger, and an anode coupled to a low voltage;
a second light-emitting diode having an anode coupled to the output terminal of the Schmidt trigger, and a cathode coupled to the low voltage; and
a bipolar junction transistor having a base for receiving a photocurrent emitted by the first light-emitting diode or the second light-emitting diode to turn on itself to generate a collector current, an emitter coupled to a ground, and a collector coupled to the output voltage.

8. The relay of claim 1, wherein the second contact is used for receiving the input signal when the first contact is used for receiving the power signal.

* * * * *